(12) United States Patent
Chiu et al.

(10) Patent No.: US 9,105,763 B2
(45) Date of Patent: Aug. 11, 2015

(54) LIGHT EMITTING DIODE CHIP AND MANUFACTURING METHOD THEREOF

(71) Applicant: ADVANCED OPTOELECTRONIC TECHNOLOGY, INC., Hsinchu Hsien (TW)

(72) Inventors: Ching-Hsueh Chiu, Hsinchu (TW); Ya-Wen Lin, Hsinchu (TW); Po-Min Tu, Hsinchu (TW); Shih-Cheng Huang, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 0 days.

(21) Appl. No.: 14/062,830

(22) Filed: Oct. 24, 2013

(65) Prior Publication Data
US 2014/0327036 A1    Nov. 6, 2014

(30) Foreign Application Priority Data

May 3, 2013    (CN) .......................... 2013 1 0160171

(51) Int. Cl.
*H01L 33/00* (2010.01)
*H01L 21/00* (2006.01)
*H01L 33/02* (2010.01)
*H01L 33/06* (2010.01)

(52) U.S. Cl.
CPC .............. *H01L 33/02* (2013.01); *H01L 33/007* (2013.01); *H01L 33/06* (2013.01)

(58) Field of Classification Search
CPC .............................. H01L 33/0075; H01L 1/32
USPC ........................................... 257/103; 438/478
See application file for complete search history.

(56) References Cited

U.S. PATENT DOCUMENTS

| | | | | |
|---|---|---|---|---|
| 5,740,193 | A  * | 4/1998 | Okuyama et al. | 372/45.01 |
| 2007/0057282 | A1* | 3/2007 | Kinoshita et al. | 257/133 |
| 2007/0057337 | A1* | 3/2007 | Kano et al. | 257/431 |
| 2008/0251781 | A1* | 10/2008 | Han et al. | 257/13 |
| 2009/0267098 | A1* | 10/2009 | Choi | 257/98 |
| 2010/0187496 | A1* | 7/2010 | Yan | 257/13 |

(Continued)

FOREIGN PATENT DOCUMENTS

CN          101840971 A          9/2010

OTHER PUBLICATIONS

Jiang et al., AlGaN and InAlGaN alloys-epitaxial growth, optical and electrical properties, applications, Opto-Electronics Review 10(4), 271-186 (2002).*

*Primary Examiner* — Matthew Landau
*Assistant Examiner* — Igwe U Anya
(74) *Attorney, Agent, or Firm* — Novak Druce Connolly Bove + Quigg LLP

(57) ABSTRACT

A light emitting diode (LED) chip includes an N-type semiconductor layer, a compensation layer arranged on the N-type semiconductor layer, an active layer arranged on the compensation layer; and a P-type semiconductor layer arranged on the active layer. During growth of the compensation layer, atoms of an element (i.e., Al) of the compensation layer move to fill epitaxial defects in the N-type semiconductor layer, wherein the epitaxial defects are formed due to lattice mismatch when growing the N-type semiconductor. A method for manufacturing the chip is also disclosed. The compensation layer is made of a compound having a composition of $Al_xGa_{1-x}N$.

20 Claims, 4 Drawing Sheets

(56) References Cited

U.S. PATENT DOCUMENTS

| | | | |
|---|---|---|---|
| 2011/0073870 A1* | 3/2011 | Jeon et al. | 257/76 |
| 2011/0198583 A1* | 8/2011 | Nago et al. | 257/43 |
| 2012/0104355 A1* | 5/2012 | Grandusky et al. | 257/13 |
| 2012/0104360 A1* | 5/2012 | Hardy et al. | 257/18 |

* cited by examiner

LIGHT EMITTING DIODE CHIP AND MANUFACTURING METHOD THEREOF

BACKGROUND

1. Technical Field

The present disclosure generally relates to solid state light emitting devices and, more particularly, to a light emitting diode (LED) chip with high reverse voltage and a manufacturing method thereof.

2. Description of the Related Art

LEDs have many advantages, such as high luminosity, low operational voltage, low power consumption, compatibility with integrated circuits, easy driving, long term reliability, and environmental friendliness, which have promoted the wide use of LEDs as a light source.

Generally, an LED chip includes a substrate, an N-type semiconductor layer, an active layer and a P-type semiconductor layer arranged on the substrate in sequence. The active layer may be a multiple-quantum-wells (MQWs) layer. Referring to FIG. 1, a plurality of defect energy levels 10 may be distributed in the active layer of the LED chip. When applying a small reverse current for the LED chip, the electrons are easily to move from the P-type semiconductor layer to the N-type semiconductor layer through the defect energy levels 10 in the active layer; therefore, the reverse voltage of the LED is low, which is unfavorable for an LED.

Therefore, what is needed is a light emitting diode chip and a manufacturing method thereof which can overcome the described limitations.

DETAILED DESCRIPTION OF EMBODIMENTS

Figure 1:
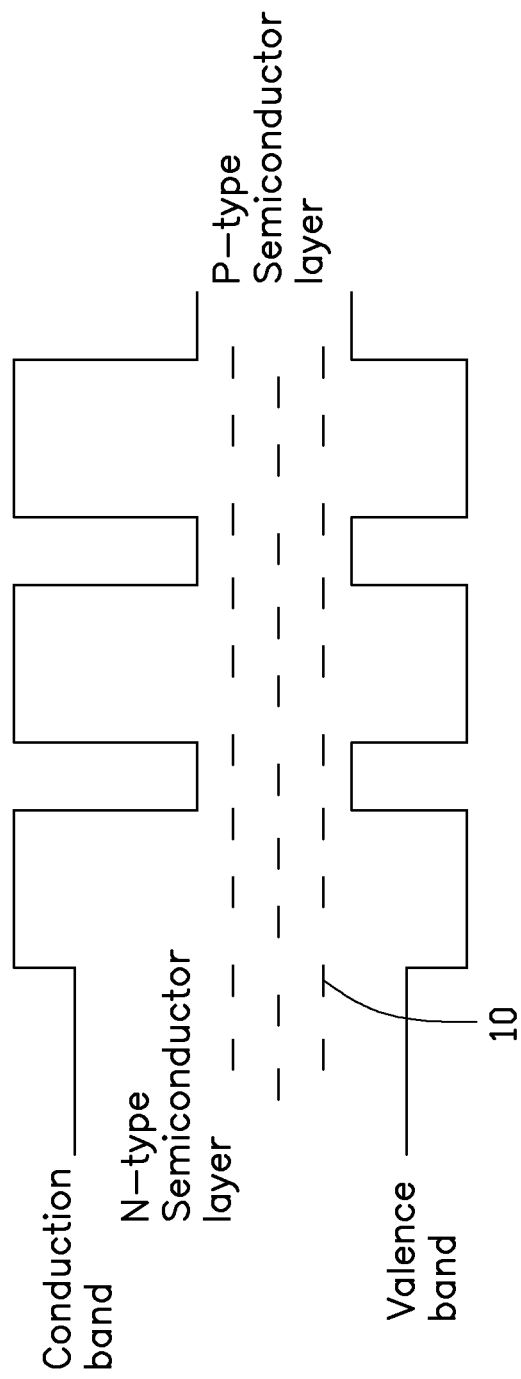
FIG. 1 is a distribution graph of energy levels of an LED chip in accordance with related art.
Figure 2:
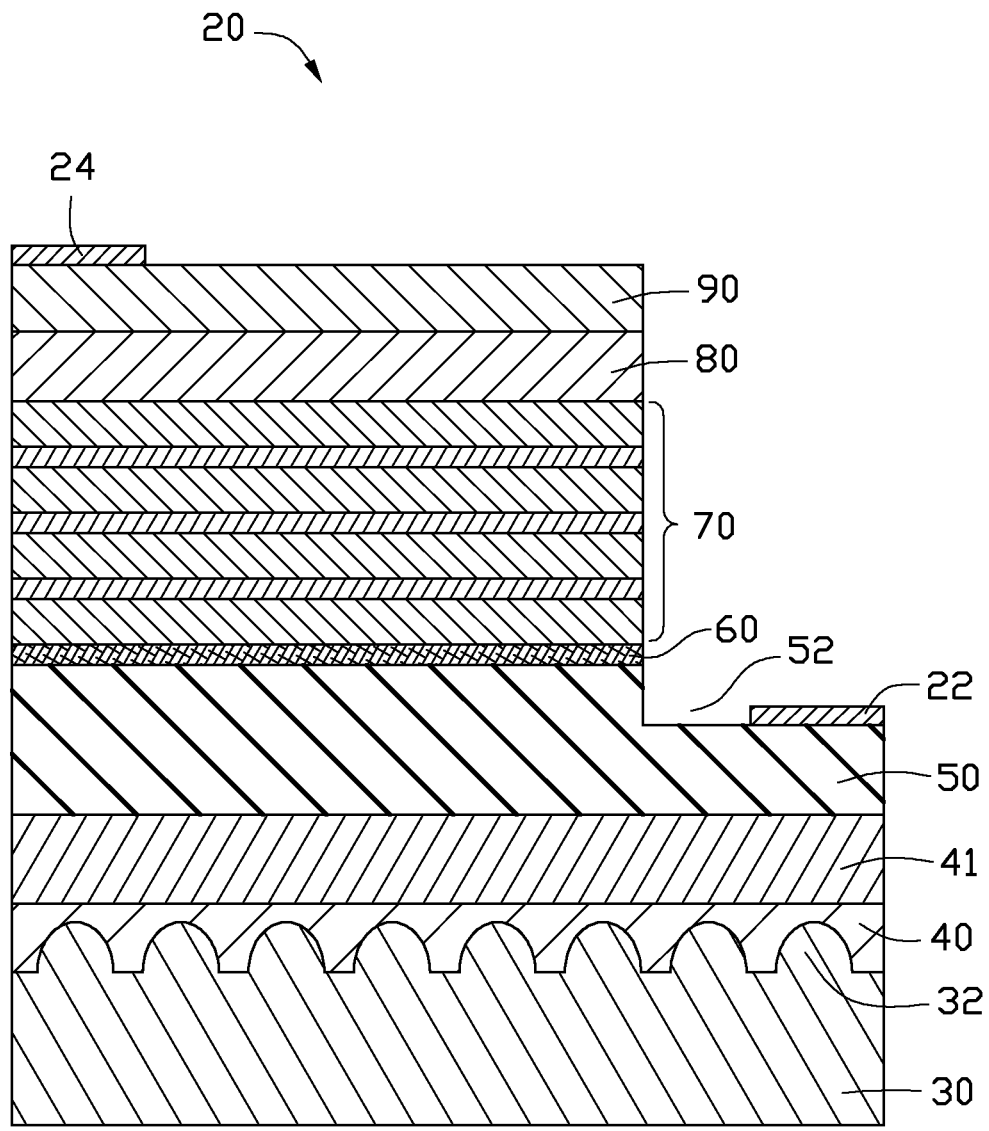
FIG. 2 is a schematic, isometric of an LED chip, according to an exemplary embodiment of the present disclosure.

Referring to FIG. 2, an LED chip 20, in accordance with an embodiment, is provided. The LED chip 20 includes a substrate 30, and a buffer layer 40, a semiconductor layer 41, an N-type semiconductor layer 50, a compensation layer 60, an active layer 70 which can be a multiple-quantum-wells (MQWs) layer, a confinement layer 80 and a P-type semiconductor layer 90 arranged on the substrate 30 in sequence.

In the present embodiment, the substrate 30 is made of a $Al_2O_3$, and a patterning structure is formed on a top surface of the substrate 30 via etching. The patterning structure includes a plurality of protrusions 32 evenly formed on the top surface of the substrate 30. In the present embodiment, each of the protrusions 32 has a peak, and the peaks of the convex protrusions 32 are coplanar. The protrusions 32 can reduce the lattice mismatch between the substrate 30 and the semiconductor layer formed on the substrate 30.

The buffer layer 40 is grown on the substrate 30. The undoped GaN layer 41 is grown on the substrate 30. The buffer layer 40 has a patterning structure at a bottom surface thereof. A top surface of the buffer layer 40 is planar. Since the top surface of the substrate 30 has the patterning structure matching with the patterning structure formed on the bottom surface of the buffer layer 40, the lattice mismatch between the substrate 11 and the buffer layer 40 is reduced. The buffer layer 40 is made of low temperature undoped GaN. The semiconductor layer 41 is made of high temperature undoped GaN.

The N-type semiconductor layer 50 is grown on the semiconductor layer 41 by epitaxy. The N-type semiconductor layer 50 is an N-type GaN layer, and can be doped with $SiH_4$. The N-type semiconductor layer 50 defines a recess 52 at a lateral side thereof. The recess 52 extends through an upper portion of the N-type semiconductor layer 50 at the lateral side thereof, along a direction from a top surface of the N-type semiconductor layer 50 towards to a bottom surface thereof. An N-type electrode 22 is formed in the recess 52 and electrically connected to the N-type semiconductor layer 50. The N-type semiconductor layer 50 provides electrons for the LED chip 20.

The compensation layer 60 is grown on the N-type semiconductor layer 50. In the present embodiment, the compensation layer 60 is made of undoped $Al_xGa_{1-x}N$ (0<x<1). The content of Al of compensation layer 60 is about 0.1 to 10 percent (0.1-10%) by weight of the compound, and a thickness of the compensation layer 60 is in the range from 1 nm to 50 nm. In the present embodiment, the content of Al of compensation layer 60 is about 1 to 2 percent (1-2%) by weight of the compound, and the thickness of the compensation layer 60 is in the range from 15 nm to 25 nm. During growth of the compensation layer 60, atoms of Al the compensation layer 60 will move downwardly to fill the few epitaxial defects which may occur over the peaks of the convex protrusions 32; therefore, the epitaxial defects due to the lattice mismatch between the substrate 30 and the buffer layer 40 is further blocked by the Al atoms of the compensation layer 60 in the N-type semiconductor layer 50, and cannot extend to the active layer 70, the confinement layer 80 and the P-type semiconductor layer 90. Furthermore, a top surface of the N-type semiconductor layer 50 can be treated by trimethylaluminum (TMAl) gas before the compensation layer 60 is grown, whereby the Al atoms of the compensation layer 60 can fill the epitaxial defects in the N-type semiconductor layer 50 and over the peaks of the convex protrusions 32 due to lattice mismatch more quickly. The epitaxial defects can be dangling bonds. Generally, the trimethylaluminum gas is applied to the N-type semiconductor layer 50 for a period less than ten seconds before the compensation layer 60 is grown on the N-type semiconductor layer 50.

In the present embodiment, the active layer 70 is grown on the compensation layer 60 directly and includes a multiple quantum well structure. In the present embodiment, the active layer 70 includes a plurality of $Al_yIn_xGa1-x-yN$ (x>0, y>0, x+y<1) layers, a plurality of $In_xGa1-xN$ (0<x<1) and a plurality of $In_xAl1-xN$ (0<x<1) layers alternatively stacked together over the compensation layer 60. The energy level of the active layer 70 is lower than that of the compensation layer 60.

The confinement layer 80 is grown on the active layer 70, and can be made of P-type AlGaN. The energy level of the confinement layer 80 is higher than that of the active layer 70. The confinement layer 80 is used to guide cavities entering into the active layer 70 and enhance the combination efficiency of the electrons and the cavities; therefore, the light extraction efficiency can be improved.

The P-type semiconductor layer 90 is grown on the confinement layer 80, and can be made of P-type GaN. Alternatively, the P-type semiconductor layer 90 is made of P-type $Cp_2Mg$. The P-type semiconductor layer 90 provides cavities for the LED chip 20. The cavities combine with the electrons provided by the N-type semiconductor layer 50 to generate photons. A P-type electrode 24 is formed on a top surface of the P-type semiconductor layer 90.

Figure 3:
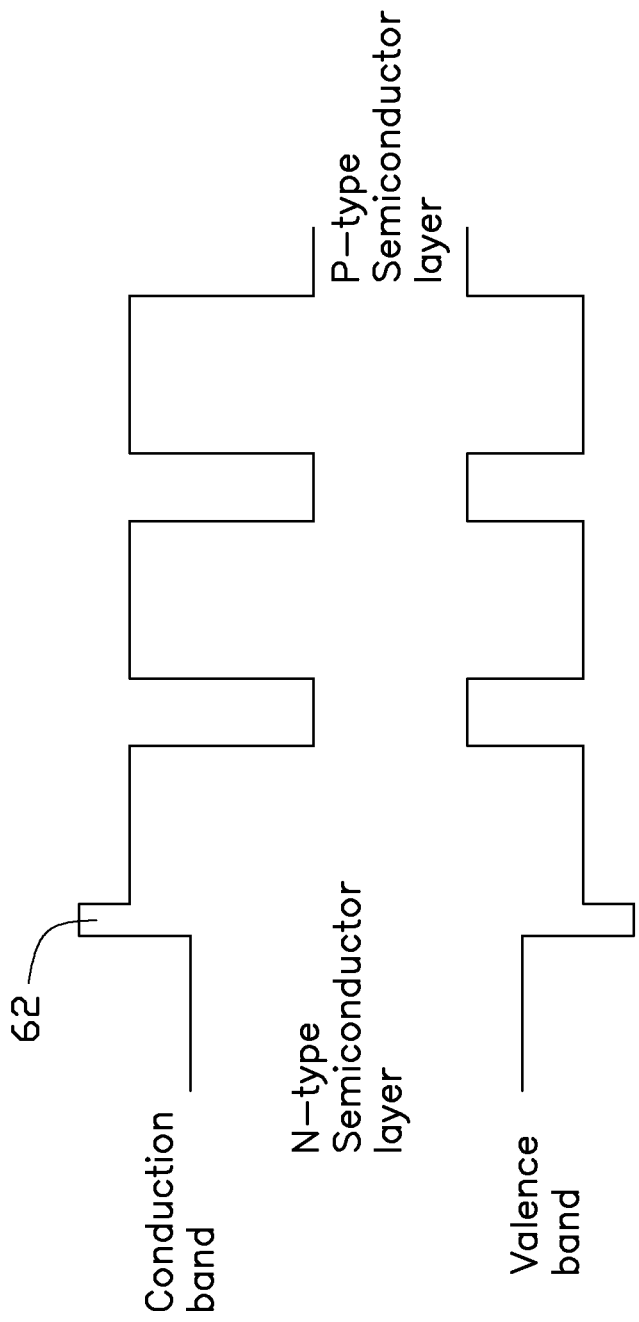
FIG. 3 is a distribution graph of energy levels of the LED chip of FIG. 2.

Referring to FIG. 3, the energy level of the compensation layer 60 is higher than that of the active layer 70, and the compensation layer 60 acts as a higher energy barrier 62 for the LED chip 20; therefore, when the LED chip 20 is applied with a small reverse current, the high energy barrier 62 of the compensation layer 60 can prevent the electrons from moving from the P-type semiconductor layer 90 to the N-type semiconductor layer 50 via the active layer 70. Thus, the LED chip 20 has a high reverse voltage to obtain a high quality thereof.

Figure 4:
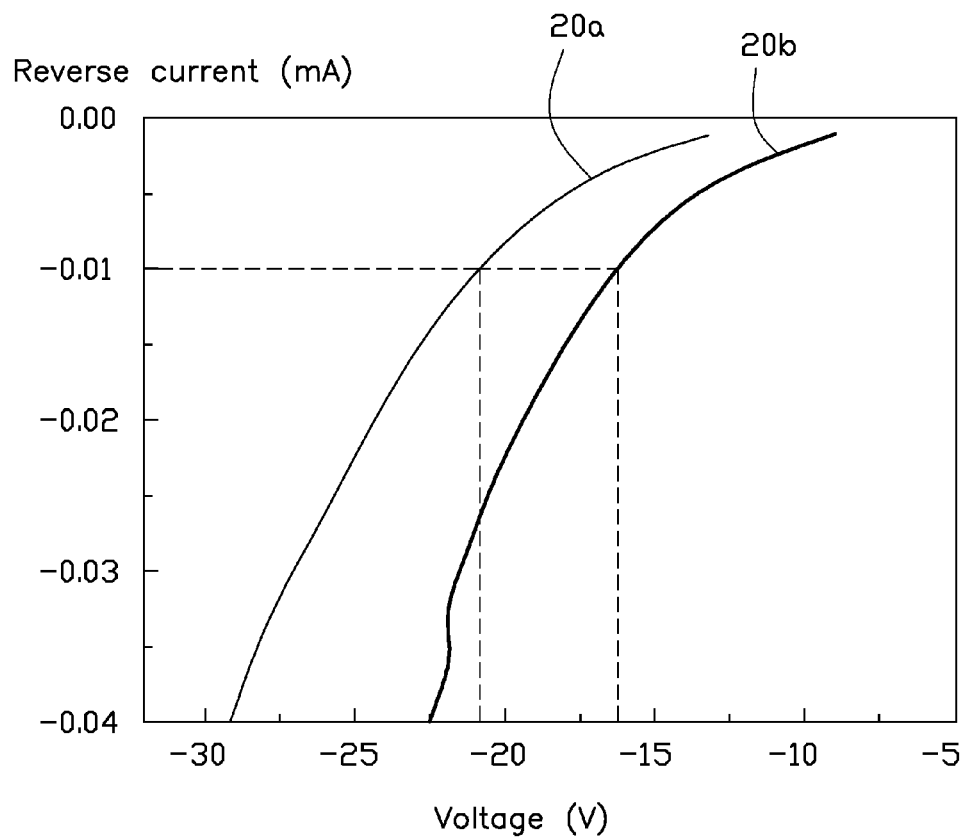
FIG. 4 is a distribution graph of a reverse voltage of the LED chip of FIG. 2 compared with a reverse voltage of the LED chip in accordance with the related art.

Referring to FIG. 4, line 20a indicates a relation of reverse voltage and reverse current of the LED chip 20 having the compensation layer 60, and line 20b indicates a relation of reverse voltage and reverse current of the LED chip without the compensation layer 60. It can be seen from FIG. 4 that, when applied with a current such as 0.01 mA, the reverse voltage of the LED chip 20 having the compensation layer 60 is 21V, and the reverse voltage of the LED chip without the compensation layer is 16V. Therefore, the LED chip 20 having the compensation layer 60 in accordance with the present disclosure has a higher reverse voltage than that of the LED chip which does not have the compensation layer.

It can be understood that the buffer layer 40, the semiconductor layer 41, the N-type semiconductor layer 50, the compensation layer 60, the active layer 70, the confinement layer 80 and the P-type semiconductor layer 90 may be grown on the substrate 30 via Metal-Organic Chemical Vapor Deposition, Molecular Beam Epitaxy, Liquid Phase Epitaxy, Vapor Phase Epitaxy, or Physical Vapor Deposition and so on.

It is to be further understood that even though numerous characteristics and advantages have been set forth in the foregoing description of embodiments, together with details of the structures and functions of the embodiments, the disclosure is illustrative only; and that changes may be made in detail, especially in matters of shape, size, and arrangement of parts within the principles of the disclosure to the full extent indicated by the broad general meaning of the terms in which the appended claims are expressed.

What is claimed is:

1. A light emitting diode (LED) chip comprising:
   an N-type semiconductor layer;
   a compensation layer arranged on the N-type semiconductor layer, atoms of a component of a compound constituting the compensation layer filling in epitaxial defects in the N-type semiconductor layer formed due to lattice mismatch;
   an active layer arranged on the compensation layer; and
   a P-type semiconductor layer arranged on the active layer; wherein the compensation layer is made of undoped $Al_xGa_{1-x}N$ (0<x<1).

2. The LED chip of claim 1, wherein the amount of Al in the compound of the compensation layer is about 0.1 to 10 percent by weight of the compound.

3. The LED chip of claim 1, wherein a thickness of the compensation layer is in the range from 1 nm to 50 nm.

4. The LED chip of claim 1, wherein the energy level of the active layer is lower than that of the compensation layer.

5. The LED chip of claim 1, wherein the active layer directly contacts the compensation layer.

6. The LED chip of claim 1, further comprising a confinement layer grown between the active layer and the P-type semiconductor layer, wherein the energy level of the confinement layer is higher than that of the active layer.

7. The LED chip of claim 1, wherein the active layer comprises a plurality of $Al_yIn_xGa_{1-x-y}N$ (x>0, y>0, x+y<1) layers, a plurality of $In_xGa_{1-x}N$ (0<x<1) and a plurality of $In_xAl_{1-x}N$ (0<x<1) layers alternatively stacked together over the compensation layer.

8. A method for manufacturing an LED (light emitting diode) chip, comprising:
   providing a substrate;
   growing an N-type semiconductor layer on the substrate;
   growing a compensation layer arranged on the N-type semiconductor layer, the compensation layer releasing atoms filling epitaxial defects in the N-type semiconductor layer formed due to lattice mismatch when growing the N-type semiconductor on the substrate, the compensation layer being made of undoped $Al_{1-x}N$ (0<x<1);
   growing an active layer on the compensation layer; and
   growing a P-type semiconductor layer on the active layer.

9. The method of claim 8, wherein before the compensation layer is grown, a top surface of the N-type semiconductor layer is treated by trimethylaluminum gas.

10. The method of claim 9, wherein the trimethylaluminum is applied to the top surface of the N-type semiconductor for a period less than ten seconds before the compensation layer is grown.

11. The method of claim 9, wherein a top surface of the substrate on which the N-type semiconductor layer is grown is formed with a plurality of convex protrusions.

12. The method of claim 11, wherein before the N-type semiconductor layer is grown on the top surface of the substrate, a buffer layer is formed on the top surface of the substrate and the N-type semiconductor is formed a top surface of the buffer layer.

13. The method of claim 12, wherein the buffer layer is made of undoped GaN.

14. The method of claim 13, wherein the epitaxial defects are located over peaks of the convex protrusions.

15. The method of claim 14, wherein the epitaxial defects are dangling bonds.

16. The method of claim 8, wherein the compensation layer releases atoms of Al to fill epitaxial defects in the N-type semiconductor layer.

17. The method of claim 16, wherein the amount of Al in the compound of the compensation layer is about 0.1 to 10 percent by weight of the compound.

18. The method of claim 17, wherein a thickness of the compensation layer is in the range from 1 nm to 50 nm.

19. The LED chip of claim 8, wherein the active layer comprises a plurality of $Al_yIn_xGa_{1-x-y}N$ (x>0, y>0, x+y<1) layers, a plurality of $In_xGa_{1-x}N$ (0<x<1) and a plurality of $In_xAl_{1-x}N$ (0<x<1) layers alternatively stacked together over the compensation layer.

20. A light emitting diode (LED) chip comprising:
   a substrate made of $Al_2O_3$;
   a buffer layer formed on the substrate, the buffer layer being made of undoped GaN layer;
   a high temperature undoped GaN layer formed on the buffer layer;
   an N-type semiconductor layer grown on the high temperature undoped GaN layer, the N-type semiconductor layer being made of $SiH_4$ doped GaN layer;
   an undoped $Al_xGa_{1-x}N$ (0<x<1) layer grown on the N-type semiconductor layer;
   an active layer formed on the undoped $Al_xGa_{1-x}N$ (0<x<1) layer, the active layer directly contacting with the undoped $Al_xGa_{1-x}N$ (0<x<1) layer;
   a P-type AlGaN layer grown the active layer; and a P-type GaN layer or a P-type Cp$_2$Mg layer formed on the P-type AlGaN layer.

* * * * *